(12) United States Patent
Takatsuki

(10) Patent No.: US 10,158,773 B2
(45) Date of Patent: Dec. 18, 2018

(54) INPUT DEVICE

(71) Applicant: KYOCERA Document Solutions Inc., Osaka (JP)

(72) Inventor: Yasushi Takatsuki, Osaka (JP)

(73) Assignee: KYOCERA Document Solutions Inc., Tamatsukuri, Chuo-ku, Osaka (JP)

( * ) Notice: Subject to any disclaimer, the term of this patent is extended or adjusted under 35 U.S.C. 154(b) by 121 days.

(21) Appl. No.: 15/300,507

(22) PCT Filed: Jun. 17, 2016

(86) PCT No.: PCT/JP2016/068135
§ 371 (c)(1),
(2) Date: Sep. 29, 2016

(87) PCT Pub. No.: WO2017/018092
PCT Pub. Date: Feb. 2, 2017

(65) Prior Publication Data
US 2017/0177094 A1    Jun. 22, 2017

(30) Foreign Application Priority Data

Jul. 30, 2015 (JP) ................................. 2015-151254

(51) Int. Cl.
| | |
|---|---|
| H04N 1/00 | (2006.01) |
| G06F 3/0489 | (2013.01) |
| G06F 3/0481 | (2013.01) |
| G06F 3/0482 | (2013.01) |
| H03M 11/08 | (2006.01) |
| H03M 11/04 | (2006.01) |

(Continued)

(52) U.S. Cl.
CPC ......... *H04N 1/00411* (2013.01); *G06F 3/023* (2013.01); *G06F 3/04817* (2013.01);
(Continued)

(58) Field of Classification Search
CPC .............. G06F 3/0238; G06F 3/04817; G06F 3/04883; G06F 3/023; G06F 3/04886;
(Continued)

(56) References Cited

U.S. PATENT DOCUMENTS 5,949,348 A * 9/1999 Kapp ..................... G06F 21/83
340/5.4
7,992,007 B2 * 8/2011 Lazzaro ............. G06Q 30/0641
713/183

(Continued)

FOREIGN PATENT DOCUMENTS

| | | |
|---|---|---|
| JP | 2005-268835 A | 9/2005 |
| JP | 2008-181325 A | 8/2008 |

(Continued)

OTHER PUBLICATIONS

"Fast Cash". State Bank of India. Jul. 10, 2015. https://www.youtube.com/watch?v=p-QfjKH9964.*

(Continued)

*Primary Examiner* — Julie Anne Watko
(74) *Attorney, Agent, or Firm* — IP Business Solutions, LLC

(57) ABSTRACT

A control section allows a screen of a display section to display a plurality of numeric keys, detects a touch gesture on the individual numeric key through a touch panel to allow an input of a numeric number corresponding to the numeric key subjected to the touch gesture, and detects an action on each of hard keys to accept an instruction to perform a function corresponding to the hard key subjected to the action. When a predetermined action is performed on one or more individuals of the hard keys, the control section assigns numeric numbers to the respective hard keys and detects an action on the individual hard key to allow an input of the numeric number corresponding to the hard key subjected to the action.

11 Claims, 8 Drawing Sheets

(51) Int. Cl.
  *H03M 11/18* (2006.01)
  *H03M 11/14* (2006.01)
  *G06F 3/0488* (2013.01)
  *G06F 3/023* (2006.01)

(52) U.S. Cl.
  CPC ...... *G06F 3/04886* (2013.01); *G06F 3/04895* (2013.01); *H03M 11/04* (2013.01); *H03M 11/08* (2013.01); *H03M 11/14* (2013.01); *H04N 1/00389* (2013.01); *H04N 1/00424* (2013.01); *H04N 1/00469* (2013.01); *G06F 3/0238* (2013.01); *H04N 2201/0094* (2013.01)

(58) Field of Classification Search
  CPC ........ G06F 3/04895; H04N 2201/0094; H04N 1/00389; H04N 1/00411; H04N 1/00424; H04N 1/00469; H03M 11/04; H03M 11/08; H03M 11/14
  See application file for complete search history.

(56) References Cited

U.S. PATENT DOCUMENTS

2002/0188872 A1* 12/2002 Willeby .............. G06F 3/04886
  726/7
2006/0224523 A1* 10/2006 Elvitigala ........... G06F 3/04886
  705/64

FOREIGN PATENT DOCUMENTS

| JP | 2009-177526 A | 8/2009 |
| JP | 2013-141795 A | 7/2013 |

OTHER PUBLICATIONS

HP 48G Series User's Guide. Cover page, pp. 25-12-25-13 and p. G-35. 8th edition, Dec. 1994.*

* cited by examiner

INPUT DEVICE

TECHNICAL FIELD

The present invention relates to input devices with hard keys and a touch panel and to image forming apparatuses.

BACKGROUND ART

Image forming apparatuses are equipped with an input device for selecting various functions and inputting numeric numbers. As such input devices, there are one with hard keys to be subjected to press actions, one which includes a display section and a touch panel overlaid on a screen of the display section and in which soft keys are displayed on the screen of the display section and touch gestures on the soft keys are detected through the touch panel, and one in which hard keys and soft keys are used in combination.

For example, in Patent Literature 1, numeric keys are displayed as soft keys on a screen of a display section and a touch gesture on any numeric key is detected through a touch panel. In Patent Literature 2, a hard key or a soft key is used.

In Patent Literature 3, both hard keys and soft keys are used. Furthermore, an individual number is previously associated with one of functions and, upon input of a number by an action on one of numeric keys (hard keys), the function associated with this number is selected. In this case, the numeric keys are used not only for inputting the numeric numbers but also for selecting the functions.

Meanwhile, if, in the case of using soft keys, an error occurs in the coordinate positions of touch gestures thereon detected through a touch panel, a touch gesture on such a soft key on a screen of a display section is not determined to be a touch gesture on this soft key and may cause a malfunction. Therefore, generally, simulation processing for correcting the coordinate positions of touch gestures to be detected through the touch panel is performed.

For example, in Patent Literature 4, numeric keys are displayed as soft keys on a screen of a display section and the coordinate positions of touch gestures are stored upon input of a passcode by actions on some of the numeric keys. When the passcode is correct, comparison is made between the coordinate positions of the touch gestures and the display positions of the numeric keys and the coordinate positions of the touch gestures are corrected. In this manner, each time the passcode is input, the coordinate positions of the touch gestures are automatically corrected.

CITATION LIST

Patent Literature

Patent Literature 1: JP-A-2013-141795
Patent Literature 2: JP-A-2009-177526
Patent Literature 3: JP-A-2005-268835
Patent Literature 4: JP-A-2008-181325

SUMMARY OF INVENTION

In input devices of image forming apparatuses or the like, a maintenance mode for maintenance and management of such an input device is set and various types of processing are performed in the maintenance mode. However, if, in a configuration where an instruction to perform the maintenance mode is given by a touch gesture on a soft key on a screen of a display section, an error occurs in the coordinate positions of touch gestures detected through a touch panel, so that touch gestures corresponding to soft keys on the display screen become difficult to detect, an instruction to transition to the maintenance mode based on the touch gesture on the soft key cannot be detected, so that the maintenance mode cannot be performed and naturally the above various types of processing in the maintenance mode cannot be performed.

Furthermore, if simulation processing for correcting the coordinate positions of touch gestures is set as one of the various types of processing, the correction of the coordinate positions of the touch gestures using this simulation processing cannot be performed, which may disable the touch gesture on any soft key on the display screen.

If, in view of the above circumstances, dedicated hard keys for giving instructions to perform the maintenance mode and various types of processing, such as the simulation processing, are provided, the above problems will be prevented from occurring. However, the number of hard keys increases, the operation of the input device becomes complicated, and the installation space for the input device is increased.

The present invention has been made in view of the above circumstances and has an object of surely enabling, even if an error occurs in the coordinate positions of touch gestures detected through a touch panel to thus make it difficult to detect touch gestures corresponding to soft keys on a display screen, inputs of instructions to perform a maintenance mode, simulation processing, and so on without increasing the number of hard keys.

An input device according to one aspect of the present invention includes:
 a display section;
 a touch panel provided on the display section;
 a plurality of hard keys through which inputs of respective instructions associated with a plurality of individual functions exclusive of functions of inputting numeric numbers are accepted; and
 a control section that allows a screen of the display section to display soft keys associated with a plurality of respective numeric numbers, detects a touch gesture on the individual soft key through the touch panel to accept an input of the numeric number corresponding to the soft key subjected to the touch gesture, and detects an action on the individual hard key to accept the instruction to perform the function corresponding to the hard key subjected to the action,
 wherein the control section assigns the numeric numbers corresponding to the individual soft keys to the respective associated hard keys and, under a condition that a predetermined operation has been performed, detects an action on the individual hard key to accept an input of the numeric number corresponding to the hard key subjected to the action.

The present invention surely enables, even if an error occurs in the coordinate positions of touch gestures detected through a touch panel to thus make it difficult to detect touch gestures corresponding to soft keys on a display screen, inputs of instructions to perform a maintenance mode, simulation processing, and so on without increasing the number of hard keys.

DESCRIPTION OF EMBODIMENTS

Hereinafter, a description will be given of an embodiment of the present invention with reference to the drawings.

Figure 1:
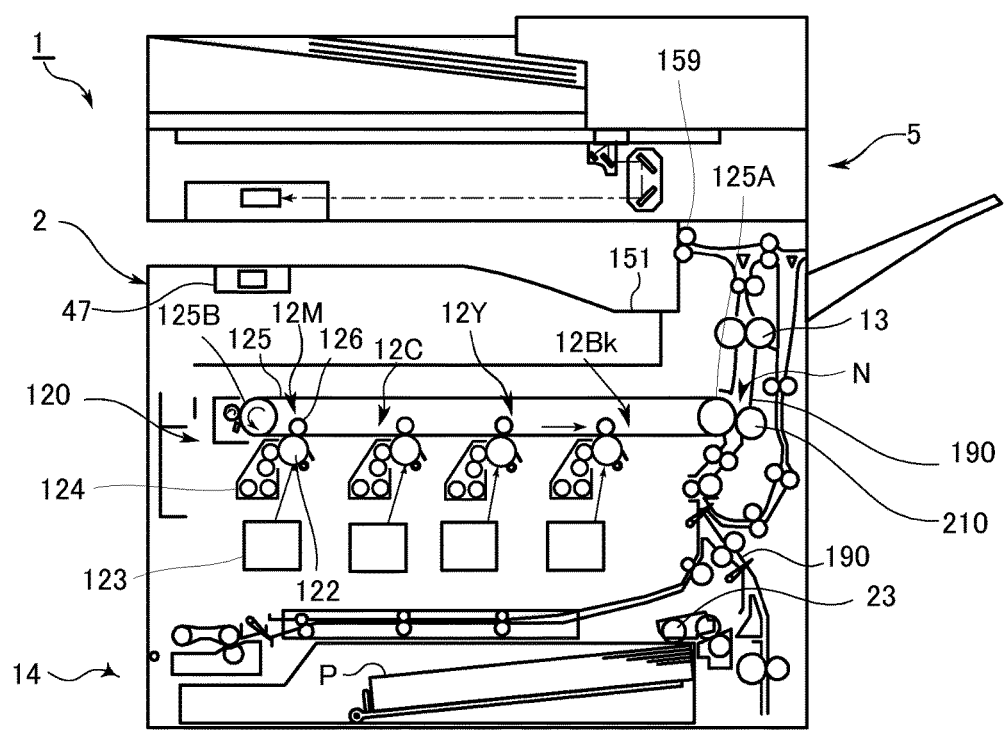
FIG. 1 is a front cross-sectional view showing the structure of an image forming apparatus to which an input device of an embodiment according to the present invention is applied.

FIG. 1 is a front cross-sectional view showing the structure of an image forming apparatus to which an input device of an embodiment according to the present invention is applied. The image forming apparatus 1 is a multifunction peripheral having multiple functions, such as a copy function, a print function, a scan function, and a facsimile function. Furthermore, the image forming apparatus 1 is made up so that an apparatus body 2 thereof is provided with an image scanner unit (ISU) 5, an input device 47, an image forming section 120, a fixing section 13, a sheet feed section 14, and so on. Each of the input device 47 and the image forming apparatus 1 with the input device 47 can be an example of the input device in Claims.

The input device 47 is operated by a user and accepts, from the user, instructions on various types of operations and processing executable on the image forming apparatus 1, such as an instruction to perform an image forming operation and an instruction to perform an image scanning operation.

In performing the image scanning operation, the image scanning unit 5 optically scans an image of an original document and generates image data. The image data generated by the image scanning unit 5 is stored on an internal HDD, a network-connected computer or the like.

In performing the image forming operation, the image forming section 120 forms a toner image on a recording paper sheet P serving as a recording medium fed from the sheet feed section 14, based on image data generated by the above image scanning operation, image data received from the network-connected computer or a user terminal device, such as a smartphone, image data stored on the internal HDD, or other image data.

Image forming units 12M, 12C, 12Y, and 12Bk of the image forming section 120 include their respective photosensitive drums 122, their respective charging devices operable to uniformly charge the surfaces of the photosensitive drums 122, their respective laser scanning units (LSU) 123 operable to expose the surfaces of the photosensitive drums 122 to laser light to form individual electrostatic latent images on the surfaces of the photosensitive drums 122, their respective developing devices 124 operable to develop the individual electrostatic latent images on the surfaces of the photosensitive drums 122 into respective toner images using toner, and their respective primary transfer rollers 126.

In performing color printing, the image forming unit 12M for magenta, the image forming unit 12C for cyan, the image forming unit 12Y for yellow, and the image forming unit 12Bk for black of the image forming section 120 uniformly charge the surfaces of their respective photosensitive drums 122, then expose them to laser light to form respective electrostatic latent images corresponding to images of their color components on the surfaces, develop the electrostatic latent images on the surfaces of the photosensitive drums 122 with the developing devices 124 to form respective toner images of their color components on the photosensitive drums 122, and then allow their respective primary transfer rollers 126 to primarily transfer the toner images to an intermediate transfer belt 125 mounted around a drive roller 125A and a driven roller 125B.

The intermediate transfer belt 125 has an outside surface designed to serve as an image carrying surface on which toner images are to be transferred and is driven in engagement against the peripheral surfaces of the photosensitive drums 122 by the drive roller 125A. The intermediate transfer belt 125 travels in an endless path between the drive roller 125A and the driven roller 125B while synchronizing with each photosensitive drum 122.

The toner images of different color components transferred to the intermediate transfer belt 125 are superposed each other on the intermediate transfer belt 125 by controlling their transfer timings, resulting in a multicolor toner image. A secondary transfer roller 210 secondarily transfers the multicolor toner image formed on the surface of the intermediate transfer belt 125, at a nip N formed with the intermediate transfer belt 125, to a recording paper sheet P conveyed from the sheet feed section 14 along a conveyance path 190.

Thereafter, heat and pressure are applied to the recording paper sheet P by the fixing section 13, so that the toner image on the recording paper sheet P is fixed by heat and pressure. Then, the recording paper sheet P is discharged through an output roller pair 159 to a sheet output tray 151.

The sheet feed section 14 contains a plurality of recording paper sheets P and drives a pick-up roller 23 into rotation to convey and feed a recording paper sheet P to the conveyance path 190.

Figure 2:
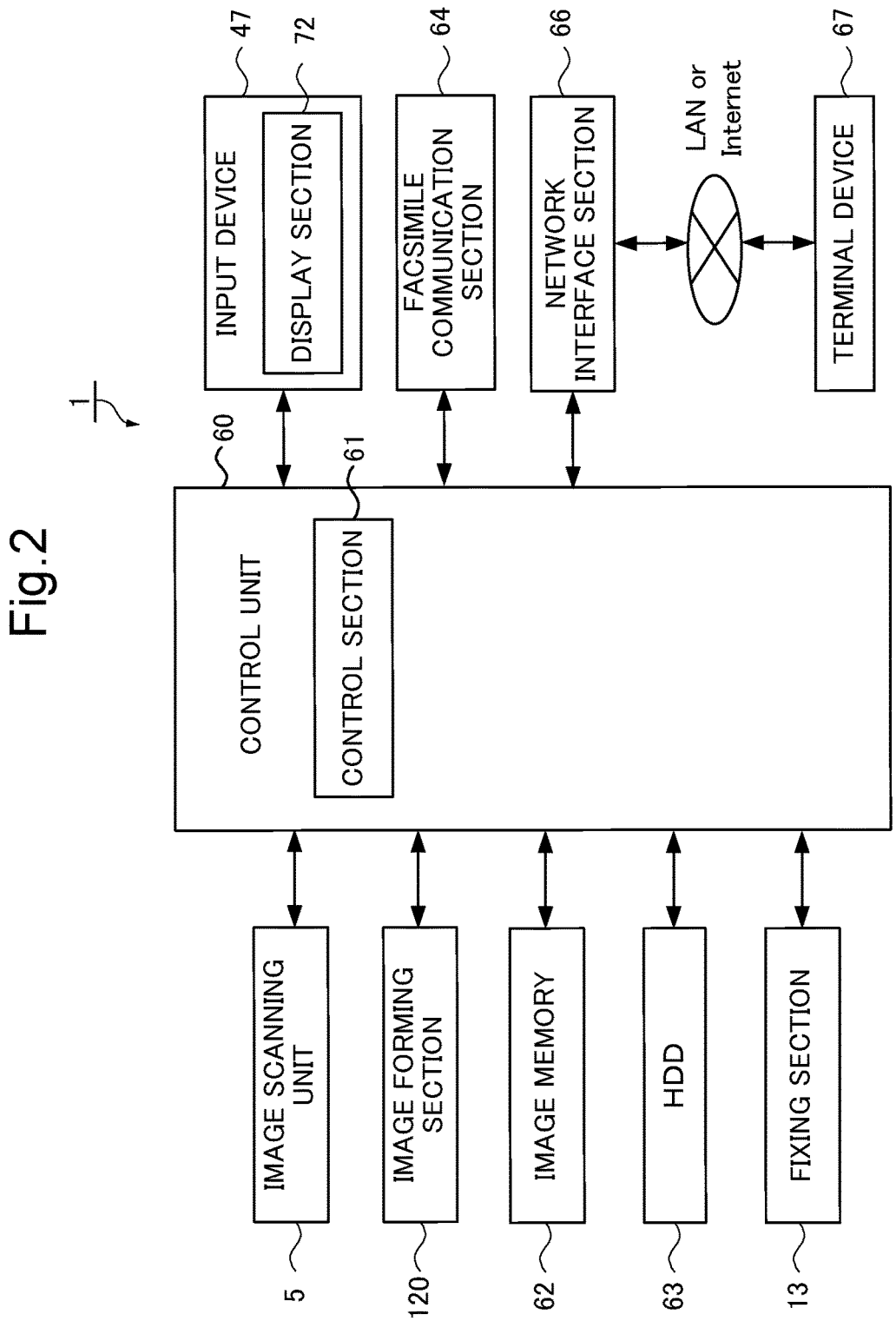
FIG. 2 is a block diagram showing a functional configuration of the image forming apparatus.

Next, a description will be given of the configuration of the image forming apparatus 1. FIG. 2 is a block diagram showing a functional configuration of the image forming apparatus 1.

The image forming apparatus 1 is made up by including a control unit 60, the image scanning unit 5, the fixing section 13, the image forming section 120, the input device 47, an image memory 62, an HDD 63, a facsimile communication section 64, a network interface section 66, and so on. The same components as those described with reference to FIG. 1 are designated by the same reference numerals.

The control unit 60 is composed of a CPU (central processing unit), a RAM, a ROM, a dedicated hardware circuit, and so on. The control unit 60 includes a control section 61. The RAM serves as a work area for the control section 61. Furthermore, the ROM stores programs and images of soft keys, icons, and so on to be displayed on the display section 72.

The control section 61 is connected to the control unit 60, the image scanning unit 5, the fixing section 13, the image forming section 120, the input device 47, the image memory 62, the HDD 63, the facsimile communication section 64, the network interface section 66, and so on and controls these components to thus totally control the image forming apparatus 1.

The facsimile communication section 64 includes a coding/decoding section, a modulation/demodulation section, and an NCU (network control unit), all of which are not illustrated, and performs facsimile communication using a public telephone network.

The network interface section 66 is constituted by a communication module, such as a LAN board, and transfers various data to and from a terminal device 67, such as a personal computer, in a local area or on the Internet via a LAN or the like connected to the network interface section 66.

The image memory 62 is a region for temporarily storing data of the document image scanned by the image scanning unit 5 and for temporarily saving data to be printed by the image forming section 120.

The HDD 63 is a large storage device for storing the document image scanned by the image scanning unit 5 or like images.

In this configuration, the user can operate the input device 47 to select any one of the facsimile communication function, the copy function, the print function, and the scan function, input values for setting items necessary for an operation of the selected function, and start the operation of the selected function. For example, when the selection of the copy function, the designation of the number and size of recording paper sheets, and the issuing of an instruction to start the copy operation is performed by operating the input device 47, the control section 61 allows the image scanning unit 5 to scan an image of an original document and allows the image forming section 120 to print the image of the original document on the designated number and size of recording paper sheets. Likewise, for the facsimile communication function, the print function, and the scan function, when the selection of a function, the inputting of values for the setting items, the start of the operation, and so on is instructed by operating the input device 47, the instructed pieces of processing are performed.

Figure 3:
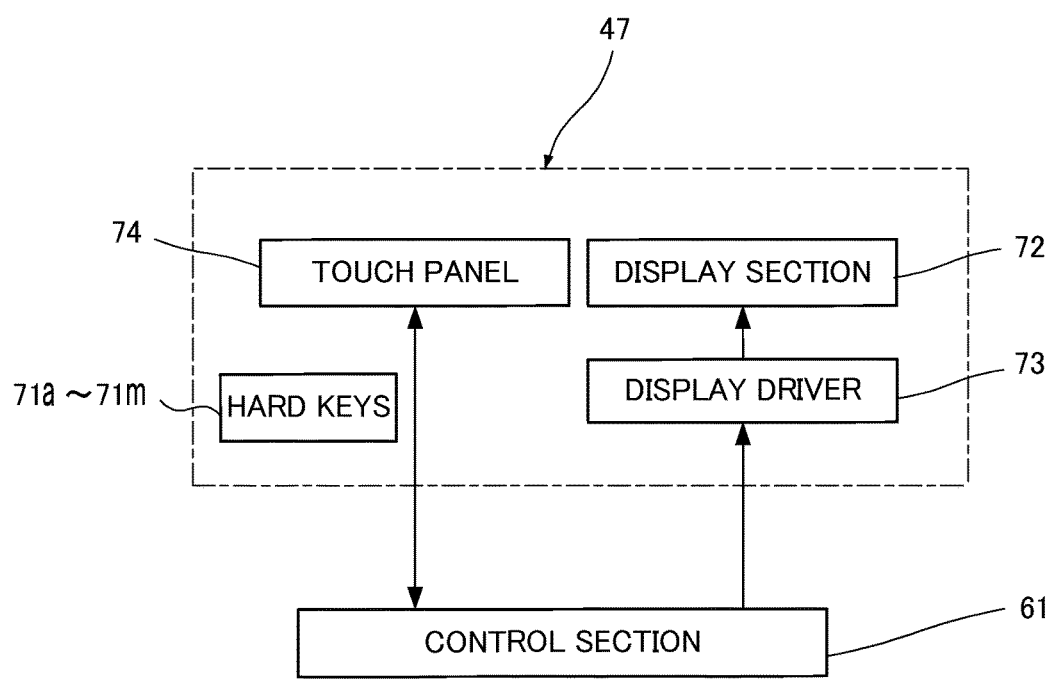
FIG. 3 is a block diagram showing a functional configuration of the input device.
Figure 4:
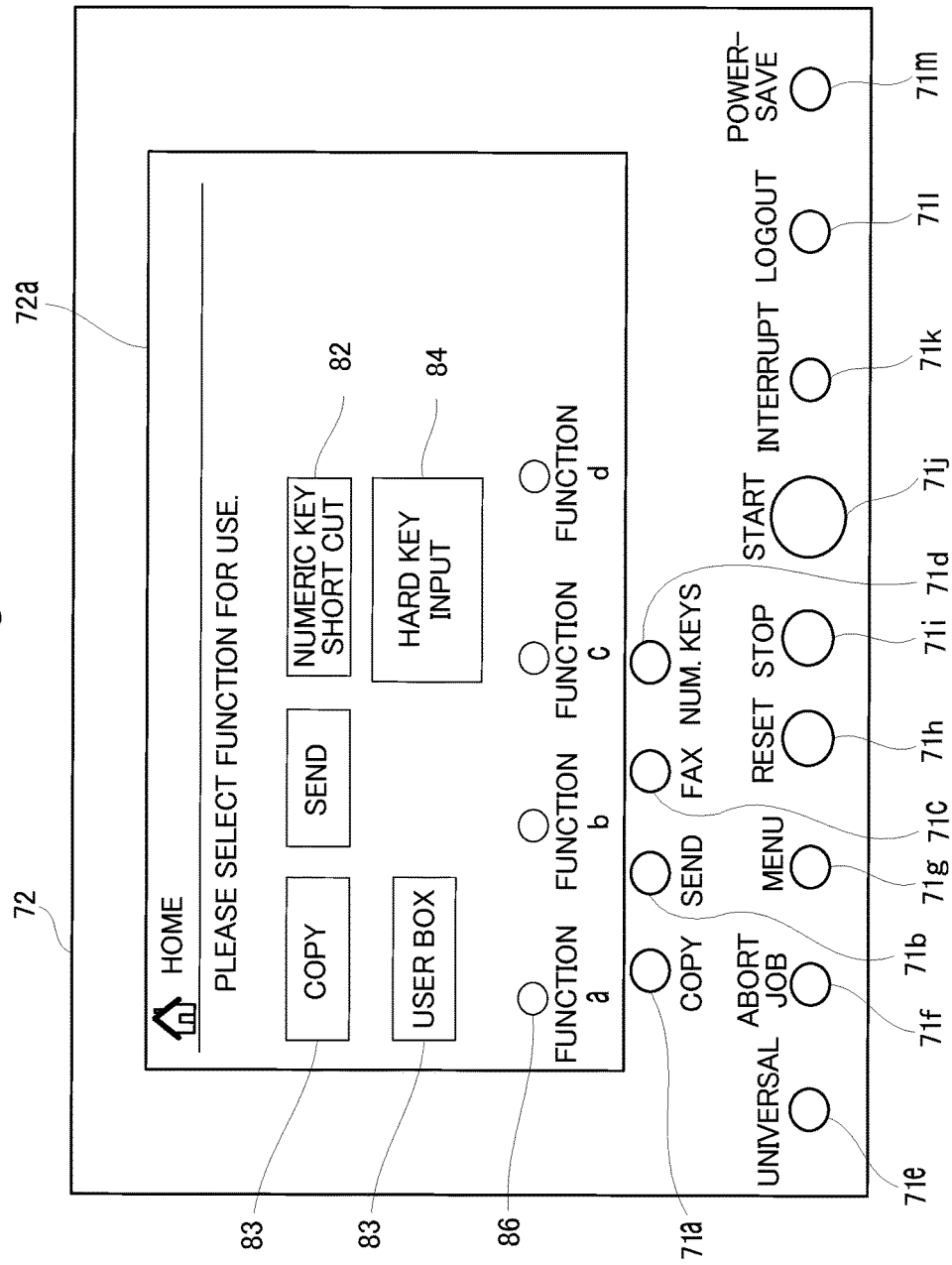
FIG. 4 is a plan view showing the input device.

Next, a description will be given in detail of the input device 47 of this embodiment. FIG. 3 is a block diagram showing a functional configuration of the input device 47. Furthermore, FIG. 4 is a plan view showing the input device 47.

The input device 47 includes a plurality of hard keys 71*a* to 71*m*, a display section 72 for displaying soft keys, icons, and so on, a display driver 73, a transparent touch panel 74 provided overlaid on a screen 72*a* of the display section 72, and so on.

The hard keys 71*a* to 71*m* are associated with "COPY", "SEND", "FAX", "NUM. KEYS", "UNIVERSAL", "ABORT JOB", "MENU", "RESET", "STOP", "START", "INTERRUPT", "LOGOUT", and "POWER-SAVE" functions, respectively, and can be pressed to give instructions to perform these functions.

When any one of the hard keys 71*a* to 71*m* is pressed, the control section 61 accepts an instruction to perform the function associated with the hard key subjected to the press action.

Furthermore, when a touch gesture is made on the screen 72*a* of the display section 72, the touch panel 74 detects the coordinate position of the touch gesture on the screen 72*a*. For example, a resistive film touch panel, a capacitive touch panel or a surface capacitive touch panel can be applied as the touch panel 74.

The control section 61 controls the display section 72 via the display driver 73 and allows the screen 72*a* of the display section 72 to display soft keys 86, icons 82 to 84, and so on. Furthermore, when the coordinate position of a touch gesture on the screen 72*a* of the display section 72 is detected by the touch panel 74, the control section 61 compares the detected coordinate position with the coordinate regions of the soft keys 86 and the icons 82 to 84 on the screen 72*a* of the display section 72. Upon overlap of the coordinate position with any one of the coordinate regions of the soft keys 86 and icons 82 to 84, the control section 61 determines that the touch gesture has been made on the soft key or icon having the coordinate region overlapping the coordinate position, and accepts an input by the touch gesture on the soft key or icon. The control section 61 is an example of "the control section" in Claims.

For example, when in FIG. 4 a touch gesture is made on the icon 82 for giving an instruction to display numeric keys, the coordinate position of the touch gesture is detected by the touch panel 74. When in this case the detected coordinate position is overlapped with the coordinate region of the icon 82, the control section 61 determines that the touch gesture has been made on the icon 82, and accepts an instruction to display numeric keys. Then, since the instruction to display numeric keys has been given, the control section 61 allows the screen 72*a* of the display section 72 to display a plurality of numeric keys 81 as soft keys as shown in FIG. 5.

Figure 5:
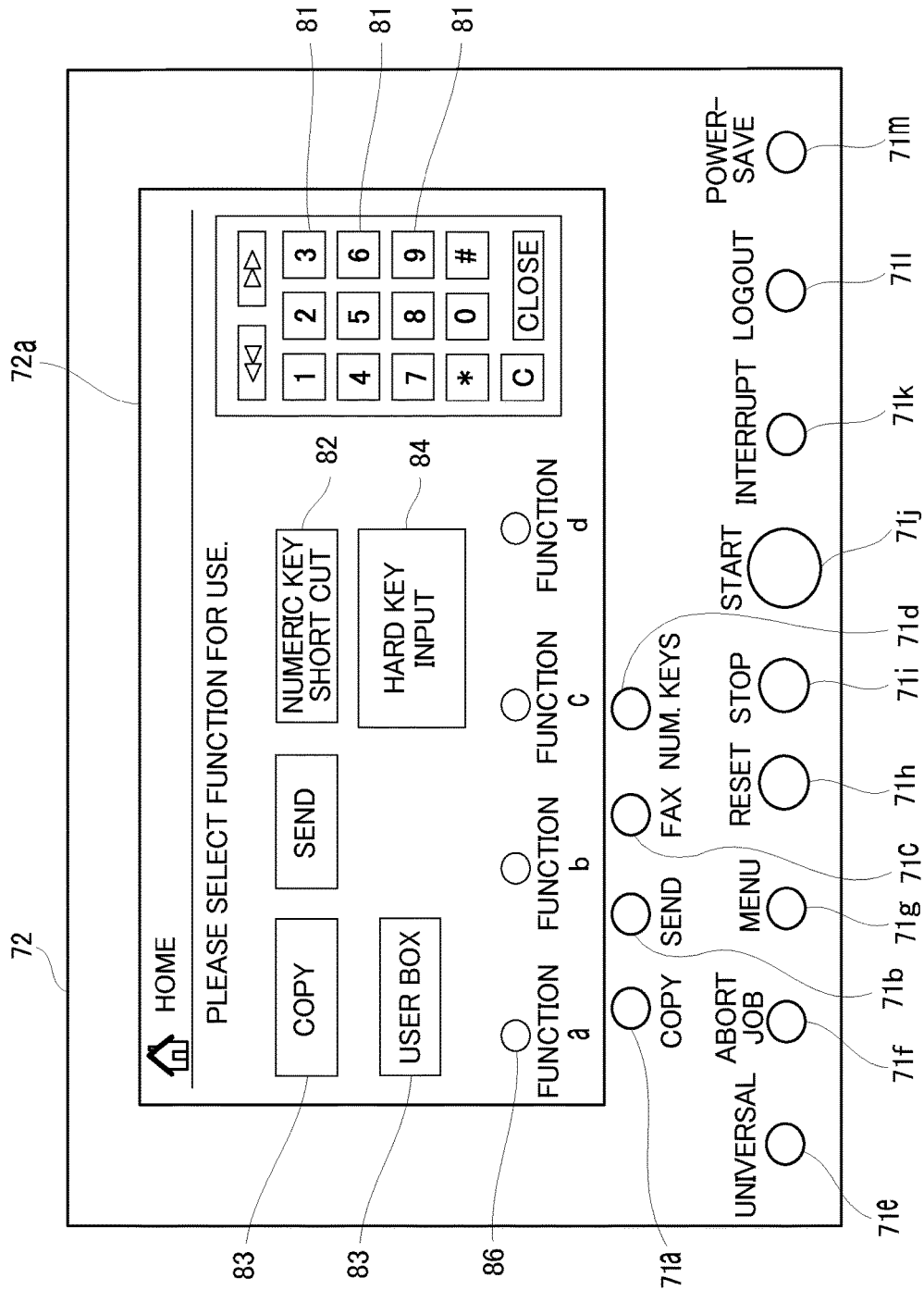
FIG. 5 is a view showing an example of a screen of a display section of the input device.

Furthermore, when in FIG. 5 a touch gesture is made on one of the numeric keys 81, the coordinate position of the touch gesture is detected by the touch panel 74. Because the detected coordinate position is overlapped with the coordinate region of the numeric key 81 subjected to the touch gesture, the control section 61 determines that the touch gesture has been made on this numeric key 81, and allows the input of the numeric number of this numeric key 81.

Moreover, when in FIGS. 4 and 5 a touch gesture is made on one of the icons 83 for giving instructions to perform various functions and the coordinate position of the touch gesture is detected by the touch panel 74, the control section 61 determines, because of overlap of the detected coordinate position with the coordinate region of the icon 83 subjected to the touch gesture, that the touch gesture has been made on this icon 83, and accepts an instruction to perform the function associated with this icon 83.

Then, when a numeric number is input by a touch gesture on a numeric key 81 on the screen of the display section 72, an instruction to perform a function is given by a touch gesture on an icon 83 or an instruction to perform a function is given by a press action on a hard key, the control section 61 outputs such a numeric number or an instruction to the control section 61 of the image forming apparatus 1. Based on the numeric number or instruction, the control section 61 controls the image forming apparatus 1 to perform various types of processing.

In the input device 47 of this embodiment, an instruction to perform a maintenance mode on the image forming apparatus 1 can be input by inputting a predetermined code formed of a sequence of a plurality of numeric numbers. For example, when the control section 61 accepts inputs of numeric numbers indicating the above code based on gestures on some of the soft keys, the maintenance mode in which various types of processing can be performed is performed by the operation of the control section 61 according to a program stored in the ROM included in the control unit 60. In performing the maintenance mode, the control section 61 selectively performs any one of the various types of processing based on a selection instruction input through the input device 47 by the operator. These types of processing are associated with respective additional predetermined codes. When any one of the codes are input by operator's actions on some individuals of the numeric keys, the control section 61 performs the type of processing associated with this code.

However, in the configuration where an instruction to perform the above maintenance mode is given by making gestures on some of the soft keys on the screen 72a of the display section 72, if an error occurs in the coordinate positions of touch gestures detected by the touch panel 74 (the positions at which gestures are made on soft keys in accepting inputs of numeric numbers based on the gestures on the soft keys), the touch gestures on the soft keys become difficult to detect, so that the maintenance mode cannot be set. Such a situation arises, for example, when data on the coordinate axes of the touch panel 74 is lost or an operation failure of the touch panel 74 occurs.

Furthermore, even if the above code is attempted to be input by making gestures on some of the numeric keys 81 on the screen 72a of the display section 72, the error already occurring in the coordinate positions of touch gestures on the numeric keys 81 makes it difficult to detect the touch gestures corresponding to the individual numeric keys 81, so that a situation arises where the type of processing corresponding to the above code cannot be performed.

Moreover, for example, in the case where simulation processing for correcting the coordinate positions of touch gestures is set as a type of processing to be performed in the maintenance mode, even if the operator attempts to input a code by touch gestures on some of the numeric keys 81 to give an instruction to perform the simulation processing, the occurrence of the above error makes it difficult to detect the touch gestures corresponding to the numeric keys 81, so that the control section 61 cannot accept an input of the instruction to perform the simulation processing. As a result, a situation also occurs where touch gestures on the soft keys and icons cannot be made.

To cope with the above, in this embodiment, the control section 61 previously associates ten of the hard keys 71a to 71m with the respective numeric numbers "0" to "9". When a predetermined press action is performed on some individuals of the hard keys 71a to 71m, the control section 61 accepts, based on an operator's action on the individual hard key 71a to 71m, an input of the numeric number associated with the hard key 71a to 71m. Furthermore, the control section 61 allows the screen 72a of the display section 72 to previously display a particularly large-sized icon 84. Also when a touch gesture is made on this icon 84, the control section 61 accepts an input of the numeric number associated with the individual hard key 71a to 71m.

Furthermore, when the predetermined press action (an example of the predetermined operation in Claims) is performed on some individuals of the hard keys 71a to 71m, the control section 61 starts to perform the maintenance mode.

Figure 6:
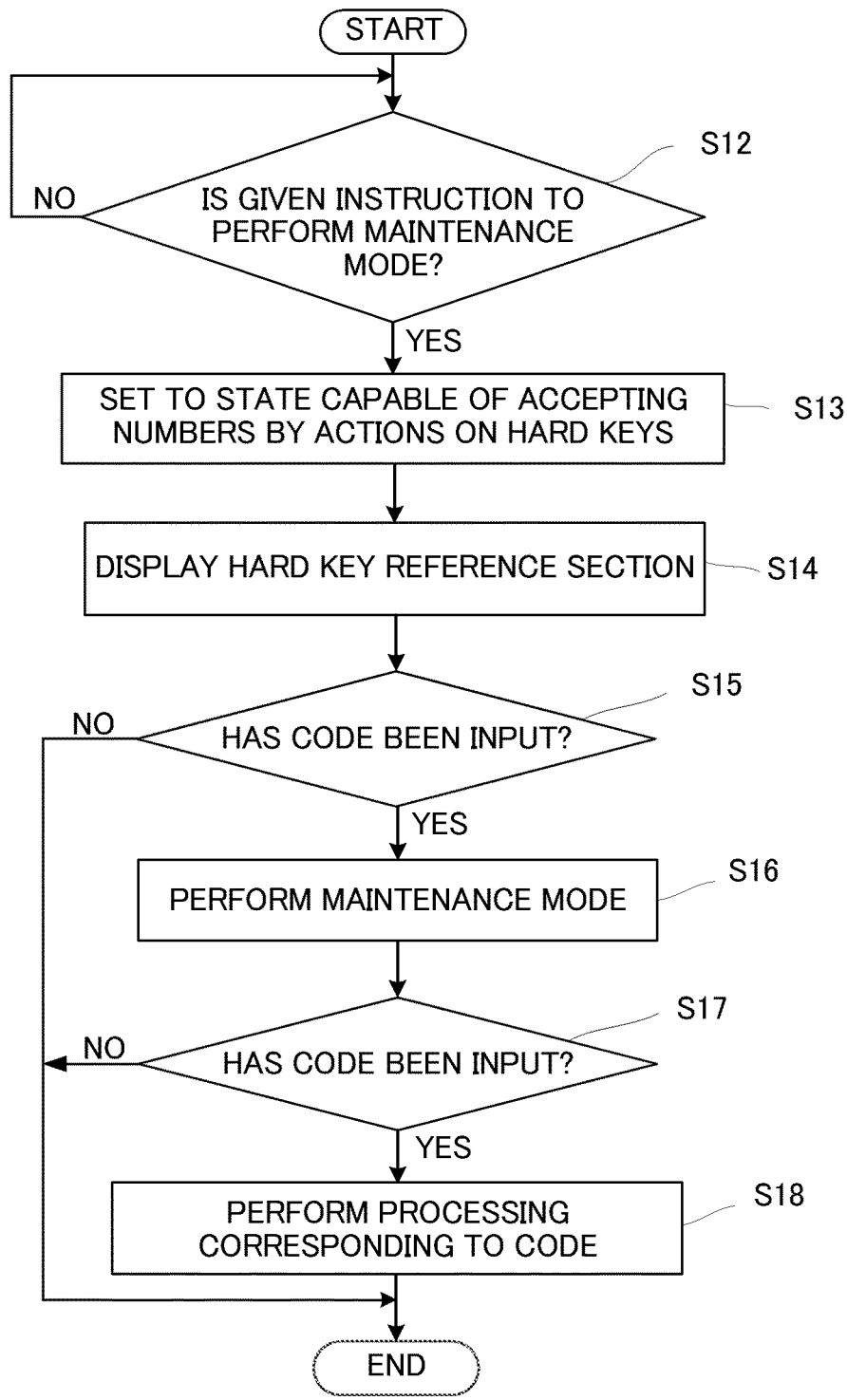
FIG. 6 is a flowchart showing a procedure from when a maintenance mode is set to when processing, such as simulation processing, is performed.

Next, a specific description will be given of a procedure from when such a maintenance mode starts to be performed to when a type of processing corresponding to a code is performed, with reference to a flowchart shown in FIG. 6.

First, the control section 61 waits for an instruction to perform the maintenance mode ("No" in step S12). In this embodiment, the control section 61 previously stores as the predetermined press action an action in which three hard keys 71h, 71i, 71j are concurrently pressed by the operator.

When the above three hard keys 71h, 71i, 71j are concurrently pressed ("Yes" in step S12), the control section 61 becomes ready to accept, based on an operator's action on the individual hard key 71a to 71m, an input of the numeric number associated with the hard key 71a to 71m (step S13).

Furthermore, also by making a touch gesture on the icon 84 displayed on the screen 72a of the display section 72 as shown in FIGS. 4 and 5, the control section 61 accepts an instruction to perform the maintenance mode. The control section 61 allows this icon 84 to be displayed at a location on the screen 72a of the display section 72 away from the peripheral edge thereof and in a sufficiently larger size than the other icons. This is because even if an error occurs in the coordinate positions of touch gestures detected by the touch panel 74, the probability of detecting a touch gesture on the icon 84 is increased.

When a touch gesture is made on the icon 84 and the coordinate position of the touch gesture is detected by the touch panel 74, the control section 61 determines, because of overlap of this detected coordinate position with the coordinate region of the icon 84, that the touch gesture has been made on the icon 84 (step S12) and, based on this determination, the control section 61 becomes ready to accept, based on an operator's action on the individual hard key 71a to 71m, an input of the numeric number associated with the hard key 71a to 71m (step S13). The touch gesture on the icon 84 is an example of the predetermined operation in Claims.

For example, the control section 61 previously stores the association of seven hard keys 71a, 71b, . . . , 71g with seven numeric numbers "0", "1", . . . , "6", respectively, and the association of three hard keys 71k, 71l, 71m with three numeric numbers "7", "8", "9", respectively. Under the condition that the above determination has been made in step S12, in order to associate ten hard keys with numeric numbers "0" to "9", the control section 61 cancels the association of the seven hard keys 71a, 71b, . . . , 71g with the "COPY", "SEND", . . . , and "MENU" functions and also cancels the association of the three hard keys 71k, 71l, 71m with the "INTERRUPT", "LOGOUT", and "POWER-SAVE" functions to become ready to accept, based on actions on the seven individual hard keys 71a, 71b, . . . , 71g and the three individual hard keys 71k, 71l, 71m, inputs of the numeric numbers associated with the respective hard keys.

Figure 7:
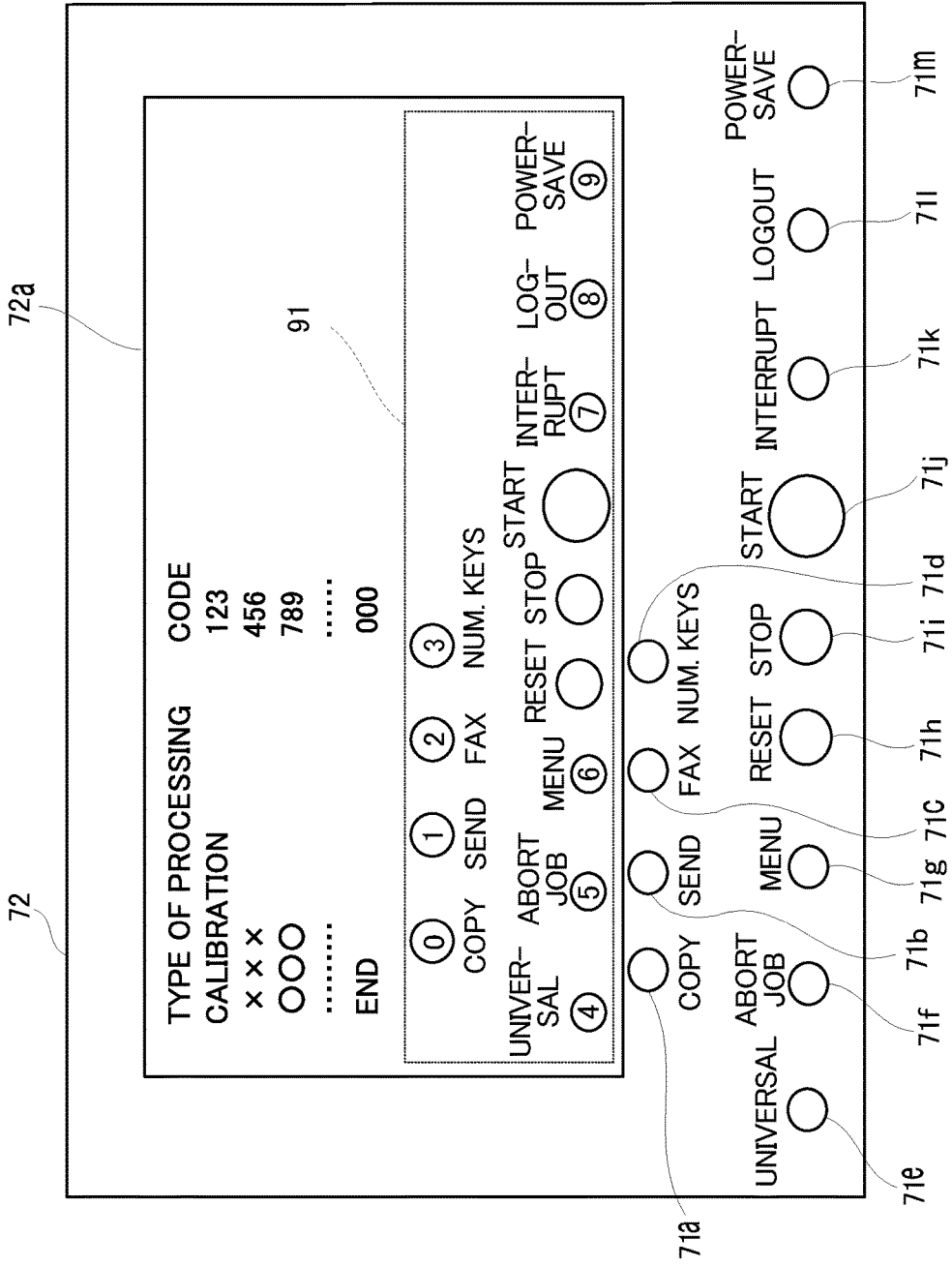
FIG. 7 is a view showing another example of the screen of the display section of the input device.

Furthermore, the control section 61 allows a display section 72 to display the screen 72a of the display section 72 as shown in FIG. 7. Displayed on this screen 72a in FIG. 7 are a hard key reference section 91 showing a correspondence relation between hard keys and the respective numeric numbers which can be input by actions on the hard keys and a correspondence relation between types of processing included in the maintenance mode and the respective codes for the types of processing (step S14).

In the hard key reference section 91, images of the hard keys 71a to 71m are displayed and the numeric numbers "0" to "9" are displayed superposed on the respective images of the ten hard keys 71a, 71b, . . . , 71g, 71k, 71l, 71m. In other words, a correspondence relation between the above ten hard keys and the numeric numbers "0" to "9" is displayed. Therefore, the user can selectively press the hard keys with reference to the correspondence relation and thus easily and surely input a code formed of a plurality of numeric numbers as an instruction to perform the maintenance mode.

When in this state an individual of the ten hard keys 71a, 71b, . . . , 71g, 71k, 71l, 71m is selectively pressed, the control section 61 accepts an input of the numeric number assigned to the hard key subjected to the press action. For example, when the hard key 71a is pressed, the control section 61 accepts an input of the numeric number "0" assigned to the hard key 71a. When the hard key 71b is pressed, the control section 61 accepts an input of the numeric number "1" assigned to the hard key 71b.

Then, when a code serving as an instruction to perform the maintenance mode is input by selective press actions on some individuals of the ten hard keys ("Yes" in step S15), the control section 61 starts to perform the maintenance mode (step S16).

Furthermore, when during running of the maintenance mode the predetermined code for giving an instruction to perform an individual type of processing in the maintenance mode is input by selective press actions on some individuals of the ten hard keys ("Yes" in step S17), the control section 61 accepts the instruction to perform the type of processing corresponding to the input code and performs the type of processing (step S18).

For example, when a code corresponding to simulation processing for correcting the coordinate positions of touch gestures is input by selective press actions on some individuals of the ten hard keys, an instruction to perform the simulation processing is accepted and the simulation processing is performed by the control section 61.

This simulation processing may be executed in a known manner. For example, the control section 61 allows the screen 72a of the display section 72 to display a plurality of point marks, the user sequentially makes touch gestures on the point marks, the touch panel 74 sequentially detects the coordinate positions of the touch gestures, and the amount of correction of the coordinate positions of the touch gestures is determined so that the coordinate positions of the individual point marks coincide with the coordinate positions of the individual touch gestures.

When the simulation processing ends, the control section 61 turns the display of the display section 72 back to the screen 72a of the display section 72 as in FIG. 7 and accepts an input of a code for another type of processing by selective press actions on some individuals of the ten hard keys to perform the other type of processing or accepts an input of a code for ending the maintenance mode by selective press actions on some individuals of the ten hard keys to end the maintenance mode.

As thus far described, in this embodiment, when a predetermined press action is performed on some individuals of the hard keys 71a to 71m or a touch gesture is made on the icon 84 having a sufficiently larger size than the other icons, the control section 61 associates ten of the hard keys 71a to 71m with the respective numeric numbers "0" to "9" and accepts inputs of the individual numeric numbers therethrough. Therefore, if an error occurs in the coordinate positions of touch gestures detected by the touch panel 74, so that a trouble with a touch gesture on any soft key occurs, it is possible to start to perform the maintenance mode by inputting any one of the codes for various types of processing by press actions on some individuals of the ten hard keys.

Furthermore, even if an error occurs in the coordinate positions of touch gestures detected by the touch panel 74, the simulation processing can be surely performed by inputting the above code, thus recovering the normal operation of the touch panel 74.

Moreover, since the correspondence relation between the ten hard keys and the numeric numbers "0" to "9" is shown on the screen 72a of the display section 72, the operator can easily and surely input each code formed of a plurality of numeric numbers with reference to the correspondence relation.

In addition, since there is no need to provide numeric keys and so on as hard keys, the number of hard keys can be reduced to simplify the operation of the input device 47 and save the installation space for the input device 47.

Figure 8:
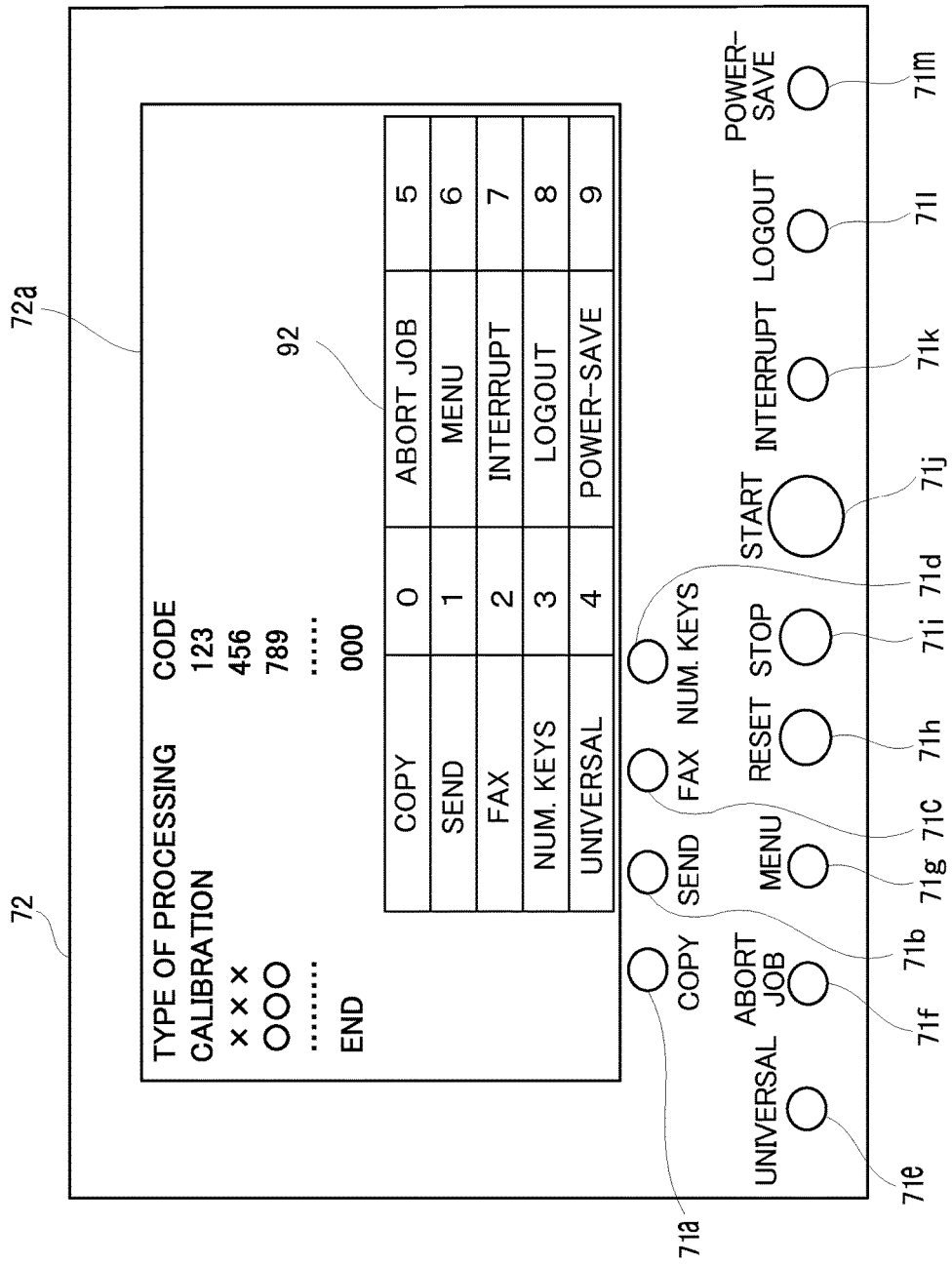
FIG. 8 is a view showing still another example of the screen of the display section of the input device.

Although in the above embodiment the correspondence relation between the ten hard keys and the numeric numbers "0" to "9" is shown in such a display manner as shown in FIG. 7, the control section 61 may allow the list display of a list 92 representing a correspondence relation between the functions of the ten hard keys and the numeric numbers "0" to "9" as shown in FIG. 8.

Furthermore, although in the above embodiment the control section 61 accepts the numeric numbers corresponding to the hard keys when the three hard keys 71h, 71i, 71j are concurrently pressed, the control section 61 may accept the numeric numbers corresponding to the hard keys when two or four hard keys are concurrently pressed or a single hard key is held down.

The control section 61 may store, according to a correspondence relation specified by the operator, the association of each of the above hard keys with one of the numeric numbers "0" to "9". For example, the control section 61 allows the display section 72 to display images indicating the numeric numbers "0" to "9". When accepting, with a press on any one of the hard keys, an input of a signal associated with the hard key and then detecting an operator's press gesture on any one of display regions of the images indicating the numeric numbers "0" to "9", the control section 61 stores the association of the hard key the associated signal of which has been accepted to be input with the numeric number indicated by the image displayed on the display region subjected to the press gesture. In this manner, the operator can input such a preset numeric number by an action on a desired hard key.

The configurations and processing described with reference to FIGS. 1 to 8 are merely embodiments of the present invention and not intended to limit the present invention to the above particular configurations and processing.

The invention claimed is:

1. An input device comprising:
a display section;
a touch panel provided on the display section;
a plurality of hard keys through which inputs of respective instructions associated with a plurality of individual functions are accepted; and
a control section that allows a screen of the display section to display soft keys associated with a plurality of respective numeric numbers, detects a touch gesture on any one of the soft keys through the touch panel to accept an input of the numeric number corresponding to the one soft key subjected to the touch gesture, and detects an action on any one of the hard keys to accept an instruction to perform the function corresponding to the one hard key subjected to the action,
wherein the control section assigns the plurality of respective numeric numbers corresponding to the soft keys to the respective associated hard keys, under a condition that a predetermined operation has been performed, detects an action on any one of the hard keys to accept an input of the numeric number corresponding to the one hard key subjected to the action, and under a condition that the predetermined operation has not been performed, detects an action on any one of the hard keys to accept an input of an instruction to perform the function corresponding to the one hard key subjected to the action,
the predetermined operation is a predetermined action on one or more individuals of the hard keys, and
when the numeric numbers input by actions on the hard keys indicate a predetermined code, the control section starts a maintenance mode in which positions of gestures on the soft keys for accepting inputs of the numeric numbers are adjustable.

2. The input device according to claim 1, wherein under a condition that the predetermined operation has been performed through at least one of the soft keys or the hard keys, the action on the one hard key is detected and the input of the numeric number corresponding to the hard key subjected to the action is accepted.

3. The input device according to claim 1, wherein the control section allows the screen of the display section to display a correspondence relation between the numeric numbers and the hard keys to which the respective numeric numbers are assigned.

4. The input device according to claim 3, wherein the correspondence relation between the numeric numbers and the hard keys to which the respective numeric numbers are assigned is shown by images representing the hard keys and the numeric numbers associated with the respective images of the hard keys.

5. The input device according to claim 3, wherein the control section allows the screen of the display section to display, in list form, the correspondence relation between the numeric numbers and the hard keys to which the respective numeric numbers are assigned.

6. An input device comprising:
a display section;
a touch panel provided on the display section;
a plurality of hard keys through which inputs of respective instructions associated with a plurality of individual functions are accepted; and
a control section that allows a screen of the display section to display soft keys associated with a plurality of respective numeric numbers, detects a touch gesture on any one of the soft keys through the touch panel to accept an input of the numeric number corresponding to the one soft key subjected to the touch gesture, and detects an action on any one of the hard keys to accept an instruction to perform the function corresponding to the one hard key subjected to the action,
wherein the control section assigns the plurality of respective numeric numbers corresponding to the soft keys to the respective associated hard keys, under a condition that a predetermined operation has been performed, detects an action on any one of the hard keys to accept an input of the numeric number corresponding to the one hard key subjected to the action, and under a condition that the predetermined operation has not been performed, detects an action on any one of the hard keys to accept an input of an instruction to perform the function corresponding to the one hard key subjected to the action,
furthermore, the control section stores, according to a correspondence relation specified by an operator, an association of each of the hard keys with one of the numeric numbers.

7. The input device according to claim 6, wherein under a condition that the predetermined operation has been performed through at least one of the soft keys or the hard keys, the action on the one hard key is detected and the input of the numeric number corresponding to the hard key subjected to the action is accepted.

8. The input device according to claim 6, wherein the control section allows the screen of the display section to display a correspondence relation between the numeric numbers and the hard keys to which the respective numeric numbers are assigned.

9. An input device comprising:
a display section;
a touch panel provided on the display section;
a plurality of hard keys through which inputs of respective instructions associated with a plurality of individual functions are accepted; and
a control section that allows a screen of the display section to display soft keys associated with a plurality of respective numeric numbers, detects a touch gesture on any one of the soft keys through the touch panel to accept an input of the numeric number corresponding to the one soft key subjected to the touch gesture, and detects an action on any one of the hard keys to accept an instruction to perform the function corresponding to the one hard key subjected to the action,
wherein the control section assigns the plurality of respective numeric numbers corresponding to the soft keys to the respective associated hard keys, under a condition that a predetermined operation has been performed, detects an action on any one of the hard keys to accept an input of the numeric number corresponding to the one hard key subjected to the action, and under a condition that the predetermined operation has not been performed, detects an action on any one of the hard keys to accept an input of an instruction to perform the function corresponding to the one hard key subjected to the action,
furthermore, the control section allows the screen of the display section to display a plurality of icons and, when detecting through the touch panel a touch gesture on a specified icon of the plurality of icons, determines the touch gesture as the predetermined operation and detects an action on any one of the hard keys to accept an input of the numeric number corresponding to the one hard key subjected to the action, and
the specified icon is displayed in a larger size than the other icons.

10. The input device according to claim 9, wherein under a condition that the predetermined operation has been performed by detecting through the touch panel said touch gesture on said specified icon, the action on the one hard key is detected and the input of the numeric number corresponding to the hard key subjected to the action is accepted.

11. The input device according to claim 9, wherein the control section allows the screen of the display section to display a correspondence relation between the numeric numbers and the hard keys to which the respective numeric numbers are assigned.

* * * * *